United States Patent
Cho

(10) Patent No.: US 8,108,210 B2
(45) Date of Patent: Jan. 31, 2012

(54) APPARATUS AND METHOD TO ELIMINATE NOISE FROM AN AUDIO SIGNAL IN A PORTABLE RECORDER BY MANIPULATING FREQUENCY BANDS

(75) Inventor: Yong-choon Cho, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1440 days.

(21) Appl. No.: 11/549,377

(22) Filed: Oct. 13, 2006

(65) Prior Publication Data

US 2007/0170992 A1 Jul. 26, 2007

(30) Foreign Application Priority Data

Jan. 13, 2006 (KR) .................. 10-2006-0003964

(51) Int. Cl.
*G10L 17/00* (2006.01)

(52) U.S. Cl. ........................................... 704/207

(58) Field of Classification Search ........... 704/207–210
See application file for complete search history.

(56) References Cited

U.S. PATENT DOCUMENTS

| | | | | |
|---|---|---|---|---|
| 4,427,950 A | | 1/1984 | Akagiri et al. | |
| 4,562,492 A | | 12/1985 | Higurashi | |
| 4,628,529 A | * | 12/1986 | Borth et al. | 381/94.3 |
| 4,630,304 A | * | 12/1986 | Borth et al. | 381/94.3 |
| 4,630,305 A | * | 12/1986 | Borth et al. | 381/94.3 |
| 4,737,976 A | * | 4/1988 | Borth et al. | 455/563 |
| 4,811,404 A | * | 3/1989 | Vilmur et al. | 381/94.3 |
| 5,212,764 A | * | 5/1993 | Ariyoshi | 704/233 |
| 5,251,263 A | * | 10/1993 | Andrea et al. | 381/71.6 |
| 5,384,853 A | * | 1/1995 | Kinoshita et al. | 381/71.12 |
| 5,481,615 A | * | 1/1996 | Eatwell et al. | 381/71.6 |
| 6,931,373 B1 | * | 8/2005 | Bhaskar et al. | 704/230 |
| 6,996,523 B1 | * | 2/2006 | Bhaskar et al. | 704/222 |
| 7,013,269 B1 | * | 3/2006 | Bhaskar et al. | 704/219 |
| 7,283,957 B2 | * | 10/2007 | Minde et al. | 704/229 |

FOREIGN PATENT DOCUMENTS

| | | |
|---|---|---|
| JP | 9-294038 | 11/1997 |
| KR | 1984-2901 | 12/1984 |
| KR | 1990-5654 | 3/1989 |

* cited by examiner

*Primary Examiner* — Michael N Opsasnick
(74) *Attorney, Agent, or Firm* — Stanzione & Kim, LLP

(57) ABSTRACT

A noise removing apparatus and method usable in a portable recorder to remove noise and enhance a voice signal when the voice signal with noise is input to the portable recorder. The noise removing method includes dividing an input signal into a high frequency component signal and a low frequency component signal, adjusting a magnitude of the high frequency component signal by comparing the magnitude of the divided high frequency component signal and a magnitude of the low frequency component signal, enhancing a clearness of the low frequency component signal by filtering the divided low frequency component with an adaptive filter, and adding the magnitude-adjusted high frequency component signal and the clearness-enhanced low frequency component signal.

15 Claims, 3 Drawing Sheets

APPARATUS AND METHOD TO ELIMINATE NOISE FROM AN AUDIO SIGNAL IN A PORTABLE RECORDER BY MANIPULATING FREQUENCY BANDS

CROSS-REFERENCE TO RELATED APPLICATIONS

This application claims the benefit of Korean Patent Application No. 10-2006-0003964, filed on Jan. 13, 2006, in the Korean Intellectual Property Office, the disclosure of which is incorporated herein in its entirety by reference.

BACKGROUND OF THE INVENTION

1. Field of the Invention

The present general inventive concept relates to a portable recorder, and more particularly, to a noise removing apparatus and method capable of efficiently removing noise when a voice signal with noise is input to the portable recorder.

2. Description of the Related Art

Generally, a portable recorder records a voice signal through a microphone. However, in a conventional portable recorder, a voice signal is recorded together with external environmental noise or contact noise and, as a result, sound quality is degraded when the voice signal is reproduced.

Accordingly, a noise removing technology to remove this environmental noise is needed. In general, a spectrum noise removing apparatus employs a spectral subtraction method in order to remove background noise.

The spectral subtraction method will now be explained with reference to FIG. 1.

First, an analog signal of one channel input to a microphone is converted into a digital signal. Then, framing of the digital signal is performed on a time axis domain. The frame unit signals are windowed in order to reduce information discontinuation between the frames and to reduce distortion. A fast Fourier transform (FFT) unit 110 converts the windowed signals to a frequency spectrum having spectrum information through Fourier transform.

This spectrum information is composed of magnitude spectrum information and phase spectrum information. Here, the magnitude spectrum information is used for spectral subtraction and the phase spectrum information is used for inverse fast Fourier transform (IFFT).

A noise detection unit 120 determines whether the signal of a current frame FFT-processed in the FFT unit 110 is a frame including only noise or a frame including a voice signal with noise.

If it is determined by the noise detection unit 120 that the current frame is a noise frame, a noise spectrum unit 130 stores a spectrum shape of the noise frame.

A spectral subtraction unit 140 performs subtraction of an estimated noise spectrum from the magnitude spectrum in which voice and noise are mixed.

A noise spectrum that is estimated when a noise characteristic is normal is similar to the spectrum of an actual noise component. Accordingly, the magnitude spectrum obtained by the spectral subtraction is approximately the magnitude of the voice signal from which the noise is removed.

An IFFT unit 150 performs IFFT transform of an audio spectrum output from the spectral subtraction unit 140 and restores an original signal to the time domain.

The FFT unit 110, which converts the time domain signal into the frequency domain signal and the IFFT unit 150, which restores the frequency domain signal to the time domain, require the largest amounts of computation. Accordingly, since the FFT and IFFT operations require considerable parts to perform computation in the conventional noise removing system, it is difficult to apply the system to a portable recorder.

SUMMARY OF THE INVENTION

The present general inventive concept provides a noise removing apparatus and method usable in a portable recorder, by which degradation of clearness of sound due to external environment noise and undesirable contact noise by a user can be effectively removed even with a small amount of computation in the portable recorder.

Additional aspects of the present general inventive concept will be set forth in part in the description which follows and, in part, will be obvious from the description, or may be learned by practice of the general inventive concept.

The foregoing and/or other aspects of the present general inventive concept are achieved by providing a noise removing method usable in a recorder including dividing an input signal into a high frequency component signal and a low frequency component signal, adjusting a magnitude of the high frequency component signal by comparing the magnitude of the high frequency component signal and a magnitude of the low frequency component signal, enhancing a clearness of the low frequency component signal by filtering the divided low frequency component signal with an adaptive filter, and adding the magnitude-adjusted high frequency component signal and the clearness-enhanced low frequency component signal.

The foregoing and/or other aspects of the present general inventive concept are also achieved by providing a method of removing noise from an audio signal, the method including dividing an input audio signal into a high frequency component and a low frequency component, detecting a voice region of the audio signal by comparing magnitudes of the high and low frequency components, adjusting characteristics of the high and low frequency components, respectively, based on whether the voice region is detected, and adding the adjusted high and low frequency components to generate an output audio signal.

The foregoing and/or other aspects of the present general inventive concept are also achieved by providing a method of removing noise from a voice signal, the method including receiving an input audio signal in a time domain, adjusting a first gain of a high frequency component of the audio signal in the time domain, and adjusting a second gain of a low frequency component of the audio signal in the time domain, and combining the gain adjusted high and low frequency components as an output signal.

The foregoing and/or other aspects of the present general inventive concept are also achieved by providing a noise removing apparatus usable in a recorder including a filter unit to divide an input signal into a high frequency component signal and a low frequency component signal, a gain generation unit to detect a voice region by comparing magnitudes of the high frequency component signal and the low frequency component signal divided by the filter unit, and to adjust a magnitude of a noise signal of the high frequency component signal according to whether the voice region is detected, a gain adjusting unit to adjust the high frequency component signal with respect to a gain value generated by the gain generation unit, a tonal enhancing unit to extract a tonal component from the divided low frequency component signal by filtering using an adaptive filter, and an addition unit to add the high frequency component signal magnitude-adjusted by the gain adjusting unit and the low frequency component signal tone-enhanced by the tonal enhancing unit.

The foregoing and/or other aspects of the present general inventive concept are also achieved by providing a noise removing apparatus, including a filter unit to divide an input audio signal into a high frequency component and a low frequency component, a voice region detection unit to detect a voice region of the audio signal by comparing magnitudes of the high and low frequency components, a gain unit to adjust characteristics of the high and low frequency components, respectively, based on whether the voice region is detected, and an addition unit to add the adjusted high and low frequency components to generate an output audio signal.

The foregoing and/or other aspects of the present general inventive concept are also achieved by providing a portable recorder, including a microphone to detect an analog audio signal, an analog to digital converter to convert the analog audio signal to a digital audio signal, and a noise removing device to divide the digital audio signal into a high frequency component and a low frequency component, to detect a voice region of the audio signal by comparing magnitudes of the high and low frequency components, to adjust characteristics of the high and low frequency components, respectively, based on whether the voice region is detected, and to add the adjusted high and low frequency components to generate an output audio signal.

The foregoing and/or other aspects of the present general inventive concept are also achieved by providing a computer readable medium usable in a portable recorder and containing executable code to perform a method of removing noise from a voice signal, the medium including executable code to receive an input audio signal in a time domain, to adjust a first gain of a high frequency component of the audio signal in the time domain, and to adjust a second gain of a low frequency component of the audio signal in the time domain, and executable code to combine the gain adjusted high and low frequency components as an output signal.

BRIEF DESCRIPTION OF THE DRAWINGS

These and/or other aspects of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
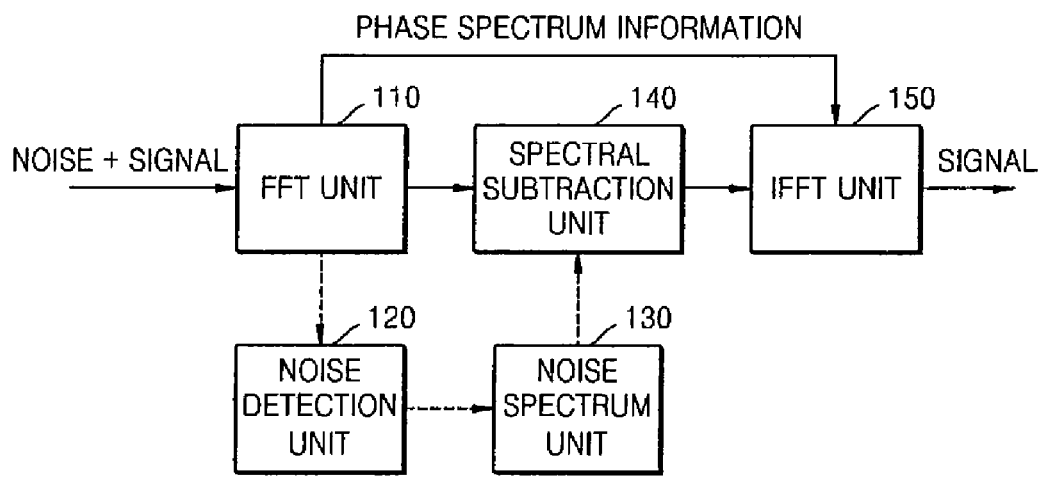
FIG. 1 is a block diagram illustrating a conventional noise removing apparatus of a recorder.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
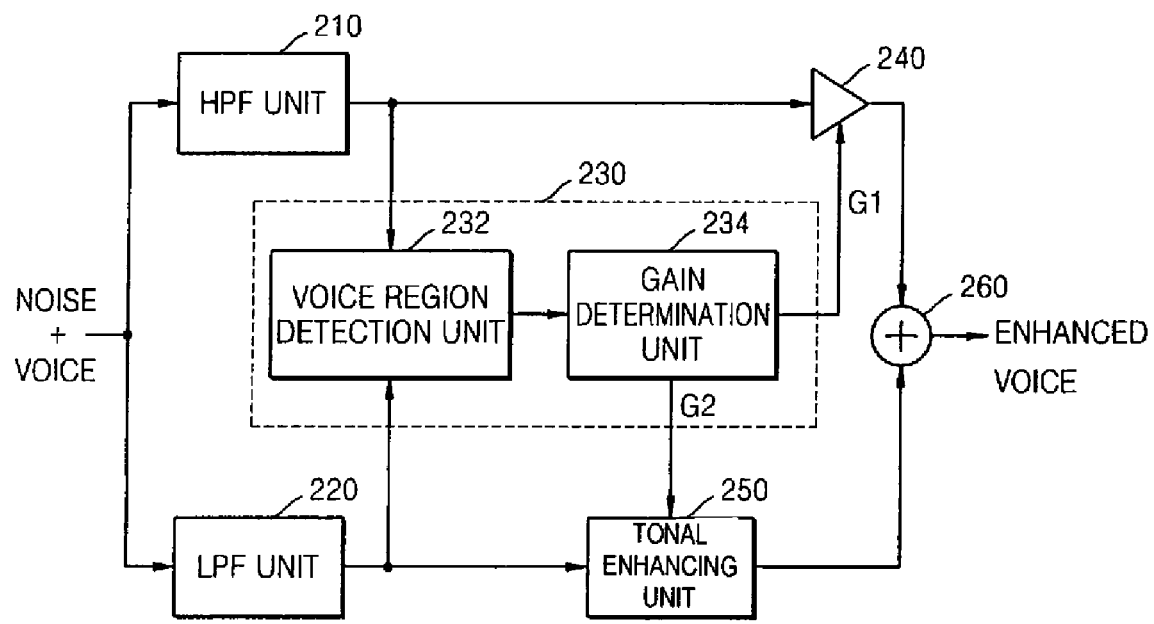
FIG. 2 is a block diagram illustrating a noise removing apparatus of a portable recorder according to an embodiment of the present general inventive concept.

FIG. 2 is a block diagram illustrating a noise removing apparatus of a portable recorder, according to an embodiment of the present general inventive concept.

The noise removing apparatus of FIG. 2 includes a high pass filter (HPF) unit 210, a low pass filter (LPF) unit 220, a gain generation unit 230, a gain adjusting unit 240, a tonal enhancing unit 250, and an addition unit 260.

First, a digital-to-analog converter (DAC) (not illustrated) converts an analog signal input through a microphone (not illustrated), in which voice (voice signal) is mixed with noise (noise signal) into a digital signal.

Then, the voice signal mixed with noise is divided into a high frequency component, in which a noise component is stronger than a voice component, and a low frequency component, in which the voice component is stronger than the noise component, by using the HPF unit 210 and the LPF unit 220. A boundary to divide the low frequency component and the high frequency component may be between 2 KHz and 3 KHz in order to enhance the voice signal in the low frequency component.

Accordingly, the HPF unit 210 passes only a predetermined high frequency component in the input signal, and the LPF unit 220 passes only a predetermined low frequency component in the input signal.

The gain generation unit 230 includes a voice region detection unit 232 and a gain determination unit 234, and generates gain values ($G_1$, $G_2$) to adjust magnitudes of the high frequency component signal and the low frequency component signal. More specifically, in the gain generation unit 230, the voice region detection unit 232 compares the magnitudes of the high frequency component and the low frequency component that are divided by the HPF unit 210 and the LPF unit 220, respectively, and detects a voice interval (i.e., a time period having the voice signal as opposed to a time period having only the noise signal). Since a noise interval is stronger in a high frequency band and a voice interval is stronger in a low frequency band, the difference between the high frequency component signal and the low frequency component signal can be used by the voice region detection unit 232 to detect which part of the low frequency component is a voice interval. Consequently, it can be determined that a signal is meaningless (that is, noise) when the high frequency component is stronger. If the voice region detection unit 232 determines that the noise is stronger in an interval, the gain determination unit 234 generates a gain value to reduce a magnitude of the high frequency component signal in the interval. If it is determined that the voice exists in an interval (i.e., the time period includes the voice signal), the gain determination unit 234 generates a gain value to restore the signal to the magnitude of an original signal (i.e., the input signal). Accordingly, this restoration prevents any high frequency components of the voice signal from being lost or weakened.

Accordingly, the gain generation unit 230 updates a gain value differently when the low frequency component is stronger and when the high frequency component is stronger, so that discontinuity does not occur in the process of following the change of the signal.

The gain adjusting unit 240 adjusts the magnitude of the high frequency component by multiplying the high frequency component signal by the gain value ($G_1$) generated by the gain generation unit 230.

The tonal enhancing unit 250 applies a running sum average method to a transient signal rapidly changing in the low frequency component output from the LPF unit 220 to reduce the transient signal. The tonal enhancing unit 250 also enhances a clearness of the voice signal by filtering the low frequency component signal, in which the transient signal is reduced, with an adaptive filter.

The addition unit 260 adds the low frequency component signal output from the tonal enhancing unit 250 and the high frequency component signal output from the gain adjusting unit 240. Accordingly, the addition unit 260 outputs a voice signal in which high frequency noise is removed and the clearness of the voice is enhanced.

Figure 3:
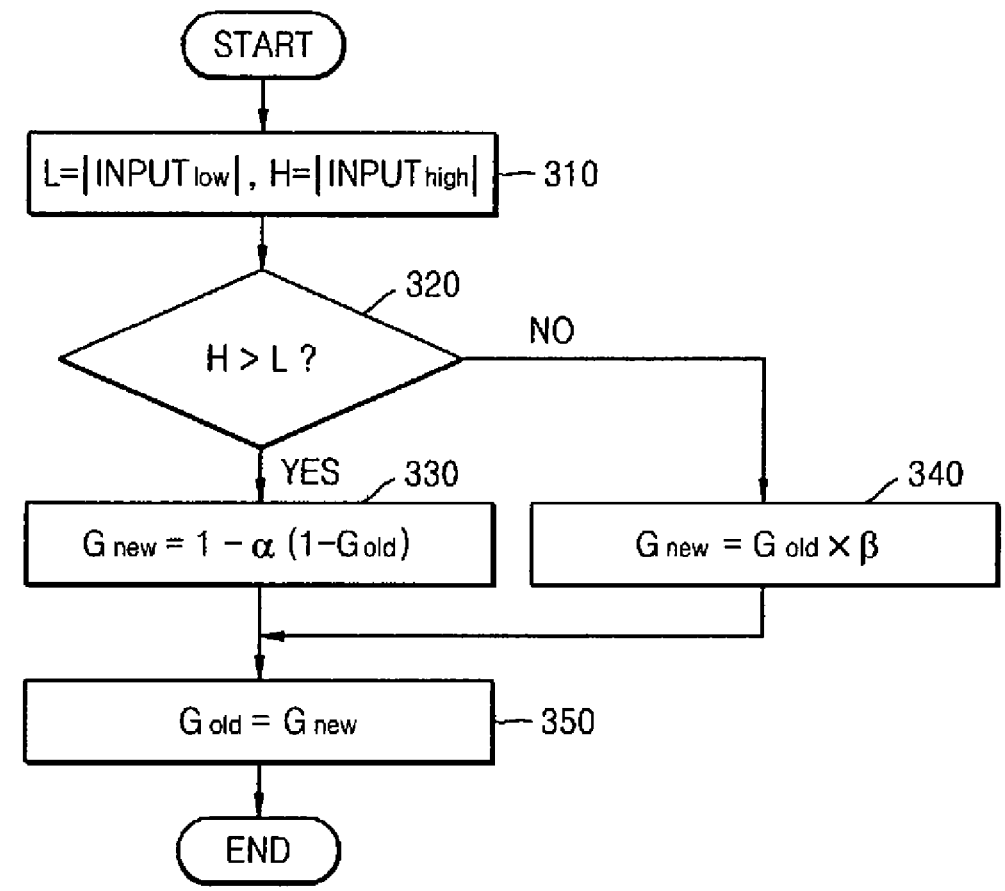
FIG. 3 is a detailed flowchart illustrating an operation of a gain generation unit of the noise removing apparatus of FIG. 2, according to an embodiment of the present general inventive concept.

FIG. 3 is a detailed flowchart illustrating an operation of the gain generation unit 230 of FIG. 2, according to an embodiment of the present general inventive concept.

First, an input signal is divided into the high frequency component and the low frequency component, and the magnitudes of the low frequency component and the high frequency component are respectively calculated in operation 310. For example, by obtaining an absolute value of a maximum level value of a signal with a predetermined cycle in each of the low frequency component and the high frequency component, the signal magnitude of the frequency component can be calculated.

Then, the calculated magnitudes of the high frequency component signal (H) and the low frequency component signal (L) are compared in operation 320.

If the magnitude of the high frequency component signal (H) is greater than that of the low frequency component signal (L), it is determined that the noise is stronger, and therefore, a gain value to reduce the magnitude of the high frequency component signal is generated in operation 330. For example, a process of updating the gain value when the high frequency component is greater than the low frequency component can be expressed as the following equation 1:

$$G_{new}=1-\alpha(1-G_{old}) \quad (1)$$

Here, $G_{new}$ is a current gain value, $G_{old}$ is a previous gain value, and $\alpha$ is a predetermined coefficient.

On the other hand, if the magnitude of the high frequency component signal (H) is less than that of the low frequency component signal (L), it is determined that the noise is weaker, and therefore, a gain value to restore the magnitude of the high frequency component signal to a magnitude of the original signal (i.e., the input signal) is generated in operation 340. For example, a process of updating the gain value when the high frequency component is less than the low frequency component can be expressed as the following equation 2:

$$G_{new}=G_{old}\times\beta \quad (2)$$

Here, $G_{new}$ is the current gain value, $G_{old}$ is the previous gain value, and $\beta$ is a predetermined coefficient.

Then, the previous gain value is updated to the current gain value in operation 350.

Figure 4:
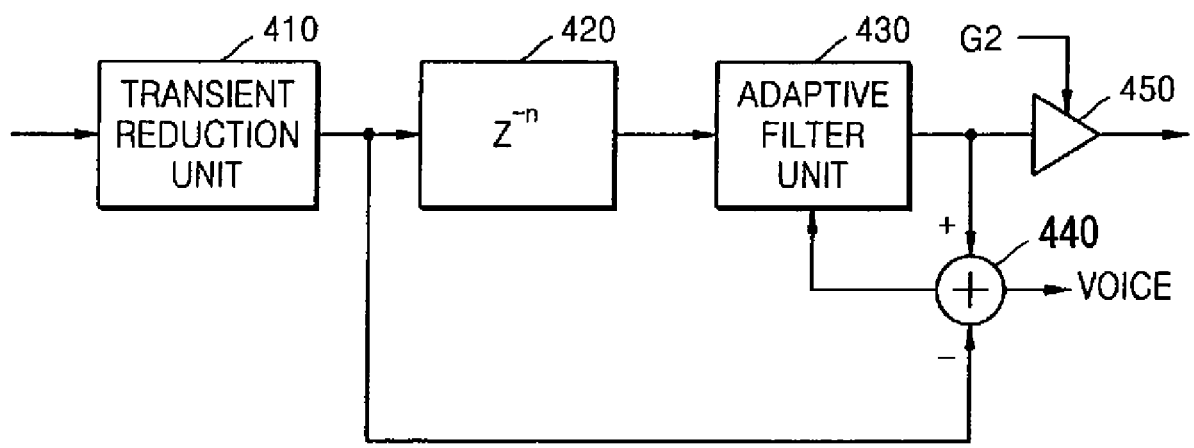
FIG. 4 is a detailed diagram illustrating a tonal enhancing unit of the noise removing apparatus of FIG. 2, according to an embodiment of the present general inventive concept.

FIG. 4 is a detailed diagram illustrating the tonal enhancing unit 250 of FIG. 2, according to an embodiment of the present general inventive concept.

First, a transient reduction unit 410 reduces a rapid change (that is, noise, such as contact noise).

Accordingly, the transient reduction unit 410 defines an interval in which the amount of changes in the low frequency component signal exceeds a predetermined level from a previous signal, as a transient interval. The transient reduction unit 410 discriminatively applies a running sum average method only to the interval defined as the transient interval. That is, the running sum average method replaces a portion of the low frequency component signal in the transient interval with an average value of a predetermined number of previous portions of the low frequency component signals so that the transient interval can be reduced.

A delay unit 420 delays the signal output from the transient reduction unit 410 for a predetermined time. The predetermined time may be set as one pitch interval of voice.

An adaptive filter unit 430 filters the low frequency component signal output from the delay unit 420. A subtraction unit 440 generates an error signal with respect to a difference between the signal output from the adaptive filter unit 430.

The adaptive filter unit 430 uses a least mean square (LMS) method in order to update a filter coefficient. That is, the adaptive filter unit 430 updates a series of filter coefficients with respect to the error signal extracted by the subtraction unit 440 to minimize the error signal the error signal. Accordingly, by minimizing the error signal based on the updated filter coefficients, the adaptive filter unit 430 extracts a tonal component signal having a predetermined cycle from the delayed low frequency component signal, and removes a non-tonal component signal therefrom.

A gain adjusting unit 450 multiplies the low frequency component signal output from the adaptive filter unit 430 by a gain value ($G_2$) generated as an inverse of the gain value ($G_1$) of the high frequency component. Referring to FIGS. 2 and 4, the gain adjusted low frequency component signal output from the adaptive filter unit 430 is then added to the gain adjusted high frequency component signal output by the gain adjusting unit 240 by the addition unit 260.

Figure 5:
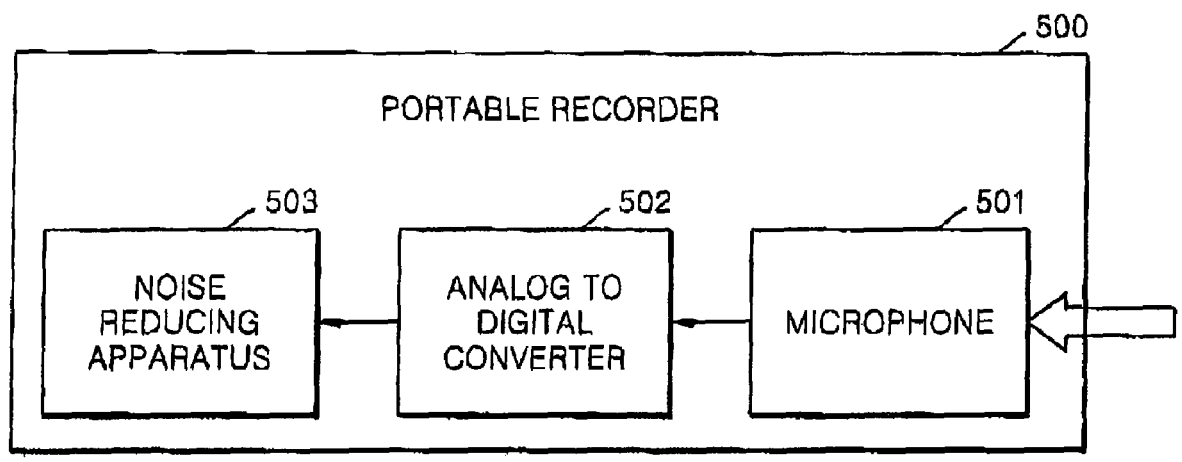
FIG. 5 is a block diagram illustrating a portable recorder according to an embodiment of the present general inventive concept.

FIG. 5 illustrates a portable recorder 500 according to an embodiment of the present general inventive concept. The portable recorder 500 includes a microphone 501 to detect an analog voice (audio) signal represented by a double arrow line, an analog to digital converter (ADC) 502 to convert the analog voice signal to a digital signal, and a noise reducing apparatus 503 to reduce noise in the digital signal. The noise reducing apparatus may operate similar to the apparatus of FIG. 2.

The present general inventive concept can be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

According to the embodiments of the present general inventive concept as described above, with a small amount of computation in a portable recorder, degradation of clearness of sound due to external environmental noise and undesirable contact noise by a user can be effectively removed.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A noise removing method usable in a recorder, the method comprising:
   dividing, using a processor, an input signal into a high frequency component signal and a low frequency component signal;
   adjusting a magnitude of the high frequency component signal based on a comparison between the magnitude of the high frequency component signal and a magnitude of the low frequency component signal;

enhancing a clearness of the low frequency component signal by filtering the divided low frequency component signal with an adaptive filter; and adding the magnitude-adjusted high frequency component signal and the clearness-enhanced low frequency component signal to output a voice signal of the low frequency component signal in which the high frequency component signal is removed.

2. The method of claim 1, wherein the adjusting of the magnitude of the high frequency component signal comprises:

calculating the magnitude of each of the low frequency component signal and the high frequency component signal;

comparing the calculated magnitudes of the high frequency component signal and the low frequency component signal;

if the magnitude of the high frequency component signal is greater than the magnitude of the low frequency component signal, generating a gain value to reduce the magnitude of the high frequency component signal, and if the magnitude of the high frequency component signal is less than the magnitude of the low frequency component signal, generating a gain value to restore the magnitude of the high frequency component signal to a magnitude of the input signal; and adjusting the magnitude of the high frequency component by the generated gain value.

3. The method of claim 1, wherein the enhancing of the clearness of the low frequency component signal comprises:

delaying the low frequency component signal input to the adaptive filter for a predetermined time;

comparing the divided low frequency component signal and the delayed and filtered low frequency component signal to extract a difference signal; and extracting a signal of a tonal component having a predetermined cycle from the low frequency component signal by updating a filter coefficient of the adaptive filter with respect to the extracted difference signal.

4. The method of claim 1, wherein the enhancing of the clearness of the low frequency component signal comprises:

defining an interval in which an amount of changes in the low frequency component signal exceeds a predetermined value as a transient interval; and replacing a portion in the low frequency component signal in the transient interval with an average value of previous portions of the low frequency component signal.

5. A method of removing noise from an audio signal, the method comprising:

dividing, using, a processor, an input audio signal into a high frequency component and a low frequency component with at least one filter;

detecting a voice region of the audio signal by comparing magnitudes of the high and low frequency components;

adjusting characteristics of the high and low frequency components, respectively, based on whether the voice region is detected; and adding the adjusted high and low frequency components to generate an output audio signal, wherein the detecting of the voice region comprises:

calculating the magnitudes of the high and low frequency components;

determining which one of the magnitudes of the high and low frequency components is greater;

determining that the voice region exists when the magnitude of the low frequency component is greater than the magnitude of the high frequency component, and the voice region does not exist when the magnitude of the low frequency component is less than the magnitude of the high frequency component.

6. A method of removing noise from an audio signal, the method comprising:

dividing, using a processor, an input audio signal into a high frequency component and a low frequency component with at least one filter;

detecting a voice region of the audio signal by comparing magnitudes of the high and low frequency components, adjusting characteristics of the high and low frequency components, respectively, based on whether the voice region is detected; and adding the adjusted high and low frequency components to generate an output audio signal, wherein the adjusting of the characteristics comprises:

reducing a level of the high frequency component when the voice region is not detected; and enhancing a tone of the low frequency component when the voice region is detected.

7. The method of claim 6, wherein the enhancing of the tone of the low frequency component comprises:

determining a transient interval of the low frequency component; and replacing the transient interval of the low frequency component with an average of previous intervals of the low frequency component;

delaying the low frequency component signal having the replaced transient interval for a predetermined time;

performing a least mean squares (LMS) filtering on the delayed low frequency component;

subtracting the low frequency component having the replaced transient interval from the LMS filtered low frequency component to determine an error signal; and updating at least one filter coefficient of the LMS filtering based on the error signal.

8. The method of claim 6, wherein the reducing of the level of the high frequency component comprises updating a gain value applied to the high frequency component according to:

$G_{new}=1-\alpha(1-G_{old})$, when the voice region is not detected, and $G_{new}=G_{old}\times\beta$, when the voice region is detected, where $G_{new}$ is a current gain value, $G_{old}$ is a previous gain value, $\alpha$ is a first predetermined coefficient, and $\beta$ is a second predetermined coefficient.

9. A method of removing noise from a voice signal, the method comprising:

receiving an input audio signal in a time domain, the input audio signal including a high frequency component and a low frequency component;

adjusting, with a gain adjusting unit, a first gain of the high frequency component of the audio signal in the time domain based on a comparison between a magnitude of the high frequency component and a magnitude of the low frequency component;

adjusting a second gain of the low frequency component of the audio signal in the time domain; and combining the gain adjusted high and low frequency components as an output signal.

10. A noise removing apparatus usable with a recorder, the apparatus comprising:

a filter unit to divide an input signal into a high frequency component signal and a low frequency component signal;

a gain generation unit to detect a voice region by comparing magnitudes of the high frequency component signal and the low frequency component signal divided by the filter unit, and to generate a gain value according to whether or not the voice region is detected;

a gain adjusting unit to adjust the high frequency component signal with respect to the gain value generated by the gain generation unit;

a tonal enhancing unit to extract a tonal component from the divided low frequency component signal by filtering with an adaptive filter; and an addition unit to add the high frequency component signal magnitude-adjusted by the gain adjusting unit and the low frequency component signal tone-enhanced by the tonal enhancing unit.

11. The apparatus of claim 10, wherein the tonal enhancing unit comprises:

a delay unit to delay the divided low frequency component signal for a predetermined time;

an adaptive filter unit having the adaptive filter to extract a tonal component signal having a predetermined cycle from the delayed low frequency component signal by updating an adaptive filter coefficient with respect to an extracted error signal; and a subtraction unit to extract the error signal corresponding to a difference between the delayed low frequency component signal and the tonal component signal by comparing the delayed low frequency component signal and the tonal component signal output by the adaptive filter unit.

12. The apparatus of claim 10, wherein the tonal enhancing unit comprises a transient reduction unit to define an interval in which an amount of changes in the divided low frequency component signal exceeds a predetermined value as a transient interval, and to replace the divided low frequency component signal in the transient interval with an average value of previous low frequency component signals.

13. The apparatus of claim 10, wherein the tonal enhancing unit comprises a gain adjusting unit to multiply a gain value generated by comparing the magnitudes of the high frequency component signal and the low frequency component signal divided by the filter unit.

14. A portable recorder, comprising:

a microphone to detect an analog audio signal;

an analog to digital converter to convert the analog audio signal to a digital audio signal; and a noise removing device to divide the digital audio signal into a high frequency component and a low frequency component, to detect a voice region of the audio signal by comparing magnitudes of the high and low frequency components, to adjust characteristics of the high and low frequency components, respectively, based on whether the voice region is detected, and to add the adjusted high and low frequency components to generate an output audio signal.

15. A non-transitory computer readable medium usable in a portable recorder and containing executable code to perform a method of removing noise from a voice signal, the medium comprising:

executable code to receive an input audio signal in a time domain, the input audio signal including a high frequency component and a low frequency component;

executable code to adjust a first gain of the high frequency component of the audio signal in the time domain based on a comparison between a magnitude of the high frequency component and a magnitude of the low frequency component;

executable code to adjust a second gain of the low frequency component of the audio signal in the time domain; and executable code to combine the gain adjusted high and low frequency components as an output signal.

* * * * *